United States Patent
Nimura et al.

(10) Patent No.: US 10,714,665 B2
(45) Date of Patent: Jul. 14, 2020

(54) BLUE LIGHT BLOCKING AND LIGHT SOURCE

(71) Applicant: FUJIFILM Corporation, Tokyo (JP)

(72) Inventors: Shigeaki Nimura, Kanagawa (JP); Shunya Katoh, Kanagawa (JP); Yuki Nakazawa, Kanagawa (JP); Kazuhiro Oki, Kanagawa (JP); Mitsuyoshi Ichihashi, Kanagawa (JP); Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/257,024

(22) Filed: Jan. 24, 2019

(65) Prior Publication Data
US 2019/0172988 A1 Jun. 6, 2019

Related U.S. Application Data

(63) Continuation of application No. PCT/JP2017/027278, filed on Jul. 27, 2017.

(30) Foreign Application Priority Data

Jul. 28, 2016 (JP) .................................. 2016-148769

(51) Int. Cl.
*H01L 33/60* (2010.01)
*G02B 5/28* (2006.01)
(Continued)

(52) U.S. Cl.
CPC .............. *H01L 33/60* (2013.01); *C09K 19/38* (2013.01); *C09K 19/3876* (2013.01);
(Continued)

(58) Field of Classification Search
None
See application file for complete search history.

(56) References Cited

U.S. PATENT DOCUMENTS

| 4,683,327 A * | 7/1987 | Stackman | C07C 69/82 526/325 |
| 5,622,648 A * | 4/1997 | Parri | C07C 69/54 252/299.01 |

(Continued)

FOREIGN PATENT DOCUMENTS

| JP | 2005230171 | 9/2005 |
| JP | 2006209092 | 8/2006 |

(Continued)

OTHER PUBLICATIONS

"International Search Report (Form PCT/ISA/210) of PCT/JP2017/027278," dated Oct. 17, 2017, with English translation thereof, pp. 1-5.

(Continued)

*Primary Examiner* — Evren Seven
(74) *Attorney, Agent, or Firm* — JCIPRNET (57) ABSTRACT

The present invention provides a blue light blocking film including a selective reflection layer, in which the selective reflection layer exhibits selective reflection having a center wavelength in a wavelength range of 450 nm to 500 nm, a half-width of the selective reflection is 20 nm to 45 nm, a light transmittance of the selective reflection layer at the center wavelength is 50% or less, and a light transmittance of the selective reflection layer at any wavelength in a wavelength range of more than 500 nm and 780 nm or less is 60% or more. The blue light blocking film of the present invention has high light transmittance in a visible light range, while effectively blocking blue light, and has a reduced yellowish tint. The blue light blocking film of the present invention is used for light sources and the like, and is capable of effectively blocking blue light.

20 Claims, 1 Drawing Sheet (51) Int. Cl.
  *H01L 33/48* (2010.01)
  *C09K 19/38* (2006.01)
  *C09K 19/58* (2006.01)
  *G02B 5/30* (2006.01)
  *H01L 33/50* (2010.01)
  *C09K 19/04* (2006.01)

(52) U.S. Cl.
  CPC .............. *C09K 19/586* (2013.01); *G02B 5/28* (2013.01); *G02B 5/3083* (2013.01); *H01L 33/48* (2013.01); *H01L 33/502* (2013.01); *C09K 2019/0448* (2013.01)

(56) References Cited

U.S. PATENT DOCUMENTS

| | | | | |
|---|---|---|---|---|
| 5,770,107 | A * | 6/1998 | Hassall | C07C 69/734 252/299.6 |
| 2007/0097509 | A1 | 5/2007 | Nevitt et al. | |
| 2009/0268460 | A1 * | 10/2009 | Van Gorkom | H01L 25/0753 362/244 |
| 2010/0295067 | A1 * | 11/2010 | Vissenberg | G02B 19/0066 257/89 |
| 2011/0176076 | A1 * | 7/2011 | Van Bommel | F21V 14/003 359/288 |
| 2016/0349573 | A1 | 12/2016 | Ohmuro et al. | |
| 2016/0357096 | A1 | 12/2016 | Ichihashi et al. | |
| 2017/0190821 | A1 | 7/2017 | Katoh et al. | |
| 2019/0235144 | A1 * | 8/2019 | Morozov | C09K 19/606 |

FOREIGN PATENT DOCUMENTS

| | | | |
|---|---|---|---|
| JP | 2009032483 | 2/2009 | |
| JP | 2009514037 | 4/2009 | |
| JP | 2015155948 | 8/2015 | |
| JP | 2015203856 | 11/2015 | |
| JP | 2016006184 | 1/2016 | |
| WO | WO-2011115043 A1 * | 9/2011 | ........... C08G 63/605 |
| WO | 2015098906 | 7/2015 | |
| WO | 2015147243 | 10/2015 | |
| WO | 2016047648 | 3/2016 | |
| WO | 2016143824 | 9/2016 | |
| WO | WO-2017159718 A1 * | 9/2017 | ............. G02B 5/223 |

OTHER PUBLICATIONS

"International Preliminary Report on Patentability (Form PCT/IPEA/409) of PCT/JP2017/027278," completed on Jul. 3, 2018, with English translation thereof, pp. 1-14.

Office Action of Korean Counterpart Application, with English translation thereof, dated Mar. 16, 2020, pp. 1-10.

* cited by examiner

BLUE LIGHT BLOCKING AND LIGHT SOURCE

CROSS-REFERENCE TO RELATED APPLICATIONS

This application is a continuation of PCT International Application No. PCT/JP2017/027278 filed on Jul. 27, 2017, which claims priority under 35 U.S.C § 119 (a) to Japanese Patent Application No. 2016-148769 filed on Jul. 28, 2016, the entire content of which is incorporated herein by reference.

BACKGROUND OF THE INVENTION

1. Field of the Invention

The present invention relates to a blue light blocking film and a light source including this blue light blocking film.

2. Description of the Related Art

Blue light suppresses secretion of melatonin and is known to affect the circadian rhythm. In particular, LEDs used for backlight and illumination of image display devices such as a personal computer, a smart phone, and a game terminal exhibit strong light emission in a blue light wavelength range.

As blue light blocking films for blocking blue light, there are films using an absorption dye (for example, JP2009-032483A and JP2005-230171A), and films utilizing reflection of an optical multilayer film (for example, JP2005-230171A and JP2015-203856A). Further, in JP2016-006184A, a cured film of a composition including a liquid crystal compound and a chiral agent is used as a blue light blocking film.

SUMMARY OF THE INVENTION

In the blue light blocking films as disclosed in JP2009-032483A, JP2005-230171A, and JP2015-203856A, the yellowish tint which is the complementary color of blue is strong. On the other hand, in JP2016-006184A, the problem of the yellowish tint of the cured film is reduced. However, JP2016-006184A discloses data indicating that the cured film has a low transmittance in a wide wavelength range including the blue light wavelength range, and it is thought that a reduction in the yellowish tint is derived from the fact that the reflectivity in the blue wavelength range is relatively lowered compared to the other wavelength ranges.

An object of the present invention is to provide a blue light blocking film which has a high light transmittance in a visible light range while effectively blocking blue light, and has a reduced yellowish tint. In particular, the object of the present invention is to provide the blue light blocking film in which a yellowish tint is reduced when viewed in an oblique direction.

The present inventors have paid attention to the fact that intrinsically photosensitive retinal ganglion cells (ipRGCs), which are photoreceptors that have been newly discovered in recent years on a mammalian retina, exhibit a photoresponse that is maximum in a wavelength range of 450 nm to 500 nm. The cells are considered to be particularly involved in the circadian rhythm. Intensive investigations on a constitution in which light in this wavelength range is selectively blocked and a yellowish tint is not easily shown when viewed in an oblique direction have conducted and thus the present invention has been completed.

That is, the present invention provides the following [1] to [9].

[1] A blue light blocking film comprising:
a selective reflection layer,
in which the selective reflection layer exhibits selective reflection having a center wavelength in a wavelength range of 450 nm to 500 nm, and a half-width of the selective reflection is 20 nm to 45 nm,
a light transmittance of the selective reflection layer at the center wavelength is 50% or less, and a light transmittance of the selective reflection layer at any wavelength in a wavelength range of more than 500 nm and 780 nm or less is 60% or more.

[2] The blue light blocking film according to [1], in which the light transmittance of the selective reflection layer at the center wavelength is 30% or less.

[3] The blue light blocking film according to [1] or [2], in which a light transmittance of the selective reflection layer at any wavelength in a wavelength range of 400 nm or more and less than 450 nm is 60% or more.

[4] The blue light blocking film according to any one of [1] to [3], in which a light transmittance when light is incident at an angle of 50° with respect to a normal direction of the blue light blocking film is 60% or more at any wavelength in a range of 430 nm to 780 nm.

[5] The blue light blocking film according to any one of [1] to [4], in which the selective reflection layer includes a cholesteric liquid crystal layer formed by curing a cholesteric liquid crystalline phase.

[6] The blue light blocking film according to [5], in which the selective reflection layer includes the cholesteric liquid crystal layer which selectively reflects right circularly polarized light and the cholesteric liquid crystal layer which selectively reflects left circularly polarized light.

[7] The blue light blocking film according to [5] or [6], in which the cholesteric liquid crystal layer is a layer formed by curing a liquid crystal composition including a liquid crystal compound having a birefringence Δn of less than 0.15.

[8] The blue light blocking film according to [7], in which the liquid crystal compound is a polymerizable compound represented by Formula (I), $$Q^1\text{-}Sp^1\text{-}[\text{-}A\text{-}L\text{-}]_m Sp^2\text{-}Q^2 \qquad (I)$$

in the formula,

A represents a phenylene group which may have a substituent or a trans-1,4-cyclohexylene group which may have a substituent, L represents a single bond or a linking group selected from the group consisting of —CH$_2$O—, —OCH$_2$—, —(CH$_2$)$_2$OC(=O)—, —C(=O)O(CH$_2$)$_2$—, —C(=O)O—, —OC(=O)—, —OC(=O)O—, —CH=CH—C(=O)O—, and —OC(=O)—CH=CH—, m represents an integer of 3 to 12, Sp$^1$ and Sp$^2$ each independently represent a single bond or a linking group selected from the group consisting of a linear or branched alkylene group having 1 to 20 carbon atoms, and a group in which one or two or more —CH$_2$—'s in the linear or branched alkylene group having 1 to 20 carbon atoms are substituted with —O—, —S—, —NH—, —N(CH$_3$)—, —C(=O)—, —OC(=O)—, or —C(=O)O—, and Q$^1$ and Q$^2$ each independently represent a hydrogen atom or a polymerizable group selected from the group consisting of groups represented by Formulae Q-1 to Q-5, where either Q$^1$ or Q$^2$ represents a polymerizable group.

[9] A light source comprising: the blue light blocking film according to any one of [1] to [8].

According to the present invention, a blue light blocking film which has a high light transmittance in a visible light range while effectively blocking blue light, and has a reduced yellowish tint is provided. In particular, in the blue light blocking film of the present invention, a yellowish tint is reduced when viewed in an oblique direction. It is possible to provide a light source capable of performing light irradiation with little adverse effect on humans using the blue light blocking film of the present invention.

DESCRIPTION OF THE PREFERRED EMBODIMENTS

Hereinafter, the present invention will be described in detail.

In the specification, a numerical range represented by using "to" indicates a range including the numerical values before and after "to" as the lower limit value and the upper limit value.

In the present specification, for example, unless otherwise specified, an angle such as "45°", "parallel", "perpendicular", or "orthogonal" means that an error from the exact angle is within a range of less 5°. The error from the exact angle is preferably less than 4° and more preferably less than 3°.

In the specification, the term "(meth)acrylate" indicates "any one or both of acrylate and methacrylate".

In the present specification, regarding circularly polarized light, the term "selective" means that the amount of light of one of right circularly polarized light component and a left circularly polarized light component is greater than that of the other circularly polarized light component. Specifically, the term "selective" indicates that the degree of circular polarization of light is preferably 0.3 or greater, more preferably 0.6 or greater, and even more preferably 0.8 or greater. It is still even more preferable that the degree of circular polarization of light is substantially 1.0. Here, the degree of circular polarization is a value represented by $|I_R-I_L|/(I_R+I_L)$ at the time of setting an intensity of right circularly polarized light component to $I_R$, and setting an intensity of left circularly polarized light component to $I_L$.

In the present specification, regarding circularly polarized light, the term "sense" means that the circularly polarized light is either right circularly polarized light or left circularly polarized light. In the sense of circularly polarized light, in a case of observing light such that the light propagates towards the front side thereof, a case where a distal end of an electric field vector rotates in a clockwise direction with an increase in time is defined as right circularly polarized light, and a case where the distal end rotates in a counter-clockwise direction is defined as left circularly polarized light.

In the present specification, regarding a twisted direction of a helix of a cholesteric liquid crystal, the term "sense" may also be used. In a case where the twisted direction (sense) of the helix of a cholesteric liquid crystal is right-handed, right circularly polarized light is reflected and left circularly polarized light is transmitted, and in a case where the sense is left-handed, left circularly polarized light is reflected and right circularly polarized light is transmitted.

Visible light rays are light rays having such a wavelength that these light rays are seen by the human eye among electromagnetic waves, and indicate light in a wavelength range of 380 nm to 780 nm. In the present specification, the term "blue light" means light of a wavelength of about 380 nm to 550 nm.

In the present specification, the term "reflectivity" at a predetermined wavelength indicates a value of reflectivity measured using a spectrophotometer when each wavelength is set. Specifically, the reflectivity can be measured at each wavelength using a spectrophotometer V-670 (manufactured by JASCO Corporation).

In the present specification, the light transmittance of visible light is set to a light transmittance obtained by a method described in JIS A5759. That is, the light transmittance is obtained by measuring the transmittance at a wavelength of 380 nm to 780 nm using a spectrophotometer, multiplying the transmittance by a weight value coefficient obtained from a spectral distribution of International Commission on Illumination (CIE) daylight D65 and a wavelength distribution and a wavelength interval of CIE spectral luminous efficiency for photopic vision and calculating a weighted average.

<<Blue Light Blocking Film>>

A blue light blocking film means a film for blocking blue light.

A blue light blocking film according to an embodiment of the present invention includes a selective reflection layer. The blue light blocking film of the present invention may include other layers such as an adhesive layer.

The blue light blocking film may have a sheet-like shape, a plate-like shape, or may have a curved surface. The blue light blocking film may be formed in a roll shape at the time of storage, production, and the like.

The thickness of the blue light blocking film is not particularly limited and is preferably in a range of 1.0 μm to 300 μm and more preferably in a range of 3.0 μm to 100 μm.

The light transmittance of visible light of the blue light blocking film is preferably 80% or more, more preferably 85% or more, even more preferably 90% or more, and particularly preferably 95% or more.

The light transmittance of the blue light blocking film when light is incident from an angle of 50° with respect to a normal direction at any wavelength in a range of 430 nm to 780 nm is preferably 60% or more, more preferably 70% or more, and even more preferably 80% or more.

<Selective Reflection Layer>

The blue light blocking film according to the embodiment of the present invention includes a selective reflection layer. The selective reflection layer exhibits selective reflection having a center wavelength in a wavelength range of 450 nm to 500 nm. It is preferable that the selective reflection layer exhibits selective reflection having a center wavelength in a wavelength range of 460 nm to 490 nm.

In addition, the half-width of the selective reflection is 20 nm to 45 nm, preferably less than 40 nm, more preferably less than 35 nm, even more preferably less than 32 nm, and particularly preferably less than 30 nm.

Since the blue light blocking film according to the embodiment of the present invention includes the selective reflection layer that reflects light in a specific wavelength range of 450 nm to 500 nm, which is a wavelength range of light in which intrinsically photosensitive retinal ganglion cells (ipRGCs) are particularly involved, of blue light, in a narrow range of a half-width of 20 nm to 45 nm, blue light in the wavelength range having a great influence on the circadian rhythm is blocked, the visible light transmittance is high and a yellowish tint is reduced. In the blue light blocking film in which such a selective reflection layer is used, a yellowish tint when viewed in an oblique direction can be reduced.

The center wavelength and the half-width of the selective reflection of the selective reflection layer can be obtained as follows. In the present specification, the center wavelength of the selective reflection means a center wavelength when measured from the normal direction of the selective reflection layer.

In a case where the transmission spectrum (which is measured from the normal direction of a cholesteric liquid crystal layer) of the selective reflection layer is measured using a spectrophotometer V-670 (manufactured by JASCO Corporation), a decreased peak in the transmittance can be observed. In a case where, of two wavelengths which are intermediate transmittances between the lowest transmittance of this decreased peak and the transmittance average in a range of 550±10 nm, the value of the wavelength on the short wavelength side is set to $\lambda_1$ (nm), and the value of the wavelength on the long wavelength side is set to $\lambda_h$ (nm), the center wavelength and the half-width of the selective reflection can be expressed by the following equations.

Center wavelength of selective reflection=$(\lambda_1+\lambda_h)/2$

Half-width=$(\lambda_h-\lambda_1)$

The light transmittance of the selective reflection layer at the center wavelength of selective reflection of the selective reflection layer is 50% or less and preferably 30% or less. The light transmittance of the selective reflection layer at any wavelength in a wavelength range of more than 500 nm and 780 nm or less is 60% or more, preferably 70% or more, more preferably 80% or more, and even more preferably 90% or more. In addition, the light transmittance at any wavelength in a wavelength range of 400 nm or more and less than 450 nm is preferably 60% or more, more preferably 70% or more, even more preferably 80% or more, and particularly preferably 90% or more. In the present specification, the light transmittance at a specific wavelength is a ratio of the light intensity in a case where the selective reflection layer is provided to the light intensity in a case where there is no selective reflection layer that is measured using a spectrophotometer V-670 manufactured by JASCO Corporation.

As the selective reflection layer, for example, a layer including a cholesteric liquid crystal layer, an interference film including a laminate of organic layers, and the like can be used. As the selective reflection layer, a layer including a cholesteric liquid crystal layer is preferably used.

[Cholesteric Liquid Crystal Layer]

In a case where the selective reflection layer is a layer including a cholesteric liquid crystal layer, the selective reflection layer may include only a single cholesteric liquid crystal layer or may include two or more cholesteric liquid crystal layers. In this case, the selective reflection layer may include other layers such as an alignment layer, in addition to the cholesteric liquid crystal layer, and may include the cholesteric liquid crystal layer only. In a case of a plurality of cholesteric liquid crystal layers, it is preferable that adjacent cholesteric liquid crystal layers are in direct contact with each other.

The thickness of the selective reflection layer including a cholesteric liquid crystal layer is preferably in a range of 1.0 μm to 300 μm and more preferably in a range of 3.0 μm to 100 μm.

In the present specification, the cholesteric liquid crystal layer means a layer formed by fixing a cholesteric liquid crystalline phase. The cholesteric liquid crystal layer may be simply referred to as a liquid crystal layer.

It is known that the cholesteric liquid crystalline phase exhibits circularly polarized light selective reflection which selectively reflects circularly polarized light of any one sense of right circularly polarized light and left circularly polarized light in a specific wavelength range and selectively transmits circularly polarized light of the other sense.

In the related art, many films formed of a composition containing a polymerizable liquid crystal compound have been known as a film including a layer formed by fixing a cholesteric liquid crystalline phase exhibiting circularly polarized light selective reflection properties, and the related art thereof can be referred to with respect to the cholesteric liquid crystal layer.

The cholesteric liquid crystal layer may be a layer in which alignment of a liquid crystal compound formed of a cholesteric liquid crystalline phase is maintained. Typically, the cholesteric liquid crystal layer may be a layer obtained in such a manner that a polymerizable liquid crystal compound is allowed to be in an alignment state of a cholesteric liquid crystalline phase, and polymerized and cured by ultraviolet irradiation, heating, or the like to form a layer having no fluidity, and at the same time, the layer is changed such that the form of alignment is not changed by an external field or an external force. Further, in the cholesteric liquid crystal layer, it is sufficient that optical properties of the cholesteric liquid crystalline phase are maintained in the layer, and the liquid crystal compound in the layer may no longer exhibit liquid crystallinity. For example, the molecular weight of the polymerizable liquid crystal compound may be increased by a curing reaction, and the liquid crystallinity may be lost.

It is sufficient that the selective reflection layer in the blue light blocking film according to the embodiment of the present invention includes a cholesteric liquid crystal layer having a center wavelength of the selective reflection in a wavelength range of 450 nm to 500 nm.

The center wavelength λ of the cholesteric liquid crystal layer depends on a pitch P (period of the helix) of a helical structure of the cholesteric phase and has a relationship of $\lambda = n \times P$ with an average refractive index n of the cholesteric liquid crystal layer.

As is obvious from the equation $\lambda = n \times P$, the center wavelength of the selective reflection can be adjusted by adjusting the average refractive index n or the pitch of the helical structure of the cholesteric liquid crystal layer.

Since the pitch of the cholesteric liquid crystalline phase depends on the kind or the concentration of chiral agent added which is used together with the polymerizable liquid crystal compound, a desired pitch can be obtained by adjusting the kind or the concentration of the chiral agent. Furthermore, methods described in "Introduction to Liquid Crystal Chemical Test", p. 46, edited by Japan Liquid Crystal Society, published by Sigma Publications, 2007, and "Liquid Crystal Handbook", p. 196, Liquid Crystal Handbook Editing Committee Maruzen can be used as a method of measuring the sense or the pitch of the helix.

Specifically, the pitch of the cholesteric liquid crystalline phase can be expressed by $P = 1/((\beta \cdot c))$. Here, c is the concentration of a chiral agent, and $\beta$ is an index of the power the chiral agent twisting the liquid crystal, and referred to as a helical twisting power (HTP). HTP can be calculated using an equation of $HTP = n/(\lambda \times 0.01 \times c)$, from the selective reflection wavelength $\lambda$ and the average refractive index n of a cholesteric liquid crystal layer formed of a polymerizable liquid crystal composition including a chiral agent and a liquid crystal compound, and the concentration c (% by mass) of the chiral agent added.

The selective reflection layer in the blue light blocking film according to the embodiment of the present invention may include cholesteric liquid crystal layers of different senses of helices. The selective reflection layer may include a cholesteric liquid crystal layer which selectively reflects right circularly polarized light and a cholesteric liquid crystal layer which selectively reflects left circularly polarized light. A difference between the center wavelengths of the selective reflection of these layers is preferably 10 nm or less and more preferably 5 nm or less. It is preferable that the center wavelengths of the selective reflection of these layers are substantially the same. Since the selective reflection layer includes the cholesteric liquid crystal layer which selectively reflects right circularly polarized light and the cholesteric liquid crystal layer which selectively reflects left circularly polarized light in which a difference between the center wavelengths of the selective reflection is in the above range, a selective reflection layer having a lower light transmittance in a wavelength range of 450 nm to 500 nm is obtained and thus it is possible to prepare a blue light blocking film which more significantly blocks blue light in a wavelength range having a great influence on the circadian rhythm.

The cholesteric liquid crystal layers having the same center wavelength as the center wavelength of the selective reflection and different senses of helices can be prepared by a method described later using liquid crystal compositions having the same composition except that chiral agents having different senses of helices to be induced are included.

A half-width of the selective reflection layer in the blue light blocking film according to the present invention is 20 nm to 45 nm in selective reflection having a center wavelength in a wavelength range of 450 nm to 500 nm. Therefore, the half-width of the cholesteric liquid crystal layer is preferably 20 nm to 45 nm in selective reflection having a center wavelength in a wavelength range of 450 nm to 500 nm.

A half-width $\Delta \lambda$ (nm) of the selective reflection range in which selective reflection is exhibited depends on the birefringence $\Delta n$ of the liquid crystal compound and the pitch P, and has a relationship of $\Delta \lambda = \Delta n \times P$. Therefore, the half-width can be controlled to 20 nm to 45 nm by adjusting $\Delta n$. $\Delta n$ can be adjusted by adjusting the kind or the mixing ratio of the polymerizable liquid crystal compound or controlling the temperature at the time of alignment fixing. Particularly, a low birefringence liquid crystal compound having a birefringence $\Delta n$ of less than 0.15 is preferably used.

In a case where light is obliquely incident to the cholesteric liquid crystal layer, the apparent center wavelength of the selective reflection shifts to the short wavelength side. Specifically, in a case where the apparent center wavelength of the selective reflection when light rays pass through the cholesteric liquid crystal layer with a refractive index $n_2$ in a normal direction of the cholesteric liquid crystal layer (a helical axis direction of the cholesteric liquid crystal layer) at an angle of $\theta_2$ is set to $\lambda_d$, $\lambda_d$ is expressed by the following equation.

$$\lambda_d = n_2 \times P \times \cos \theta_2$$

Accordingly, in a case where the center wavelength of the selective reflection of the cholesteric liquid crystal layer is in a wavelength range of 450 nm to 500 nm, when viewed in an oblique direction (for example, when observed at an angle of 50° with respect to the normal direction), the wavelength range of the center wavelength of the selective reflection shifts to a wavelength range of about 380 nm to 420 nm on the short wavelength side in which human visibility is low. Since the half-width of the selective reflection in the blue light blocking film according to the embodiment of the present invention is particularly small, a yellowish tint is further suppressed after the shift.

Also, in a case of using an interference film including a laminate of organic layers, a yellowish tint in the blue light blocking film when viewed from an oblique direction can be suppressed in the same manner.

[Method of Preparing Cholesteric Liquid Crystal Layer]

As the material used to form the cholesteric liquid crystal layer, a liquid crystal composition including a polymerizable liquid crystal compound may be used. It is preferable that the liquid crystal composition further includes a chiral agent (optically active compound). The liquid crystal composition, which is further mixed with a surfactant, a polymerization initiator, or the like if necessary and dissolved in a solvent or the like if necessary, is applied to a support, a temporary support, an alignment film, a cholesteric liquid crystal layer serving as an underlayer, or the like, and after alignment and maturing, the liquid crystal composition is cured for fixing to form a cholesteric liquid crystal layer.

(Polymerizable Liquid Crystal Compound)

A rod-like liquid crystal compound may be used as the polymerizable liquid crystal compound.

Examples of the rod-like polymerizable liquid crystal compound include a rod-like nematic liquid crystal compound. As the rod-like nematic liquid crystal compound, azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy-substituted phenylpyrimidines, phenyl dioxanes, tolans, and alkenylcyclohexyl benzonitriles are preferably used. It is possible to use not only a low molecular liquid crystal compound, but also a high molecular liquid crystal compound.

The polymerizable liquid crystal compound is obtained by introducing a polymerizable group in a liquid crystal compound. Examples of the polymerizable group include an unsaturated polymerizable group, an epoxy group, and an aziridinyl group. An unsaturated polymerizable group is preferable, and an ethylene unsaturated polymerizable group is particularly preferable. The polymerizable group can be introduced in molecules of a liquid crystal compound by various methods. The number of the polymerizable groups in the polymerizable liquid crystal compound is preferably 1 to 6, and more preferably 1 to 3. Examples of the polymerizable liquid crystal compound include compounds described in Makromol. Chem., vol. 190, p. 2255 (1989), Advanced Materials, vol. 5, p. 107 (1993), U.S. Pat. Nos. 4,683,327A, 5,622,648A, 5,770,107A, WO95/22586A, WO95/24455A, WO97/00600A, WO98/23580A, WO98/52905A, JP1989-272551A (JP-H01-272551A), JP1994-016616A (JP-1106-016616A), JP1995-110469A (JP-H07-110469A), JP1999-080081A (JP-H11-080081A), and JP2001-328973A. Two or more kinds of polymerizable liquid crystal compounds may be used in combination. The use of two or more kinds of polymerizable liquid crystal compounds may contribute to lowering the alignment temperature.

The amount of the polymerizable liquid crystal compound added in the liquid crystal composition is preferably 80% to 99.9% by mass, more preferably 85% to 99.5% by mass, and particularly preferably 90% to 99% by mass with respect to the solid content mass of the liquid crystal composition (mass excluding the mass of the solvent).

(Low Birefringence)

As described above, the liquid crystal composition for forming the cholesteric liquid crystal layer preferably includes a low birefringence liquid crystal compound as the polymerizable liquid crystal compound. By using the low birefringence liquid crystal compound, a cholesteric liquid crystal layer having a half-width of 20 nm to 45 nm can be prepared. The birefringence Δn of the low birefringence liquid crystal compound is preferably less than 0.15, more preferably 0.13 or less, and even more preferably 0.08 or less. The birefringence (Δn) of the compound is measured according to a method described in Liquid Crystal Handbook, p. 202, Liquid Crystal Handbook Editing Committee Maruzen. Specifically, the liquid crystal compound is injected into a wedge-shaped cell and irradiated with light having a wavelength of 550 nm, and the refraction angle of the transmitted light is measured. Thus, Δn at 60° C. can be obtained.

In a case where the liquid crystal composition includes a plurality of polymerizable liquid crystal compounds, the value when the birefringence of a mixture of the plurality of polymerizable liquid crystal compounds is measured as described above is preferably less than 0.15 as described above.

In addition, the liquid crystal composition for forming the cholesteric liquid crystal layer preferably has a low birefringence. For example, Δn (Re/d) at a wavelength of 550 nm calculated from a ratio between a front phase difference (Re) and a thickness (d) of a layer formed by polymerizing a monoaxially aligned liquid crystal phase, which is formed of a composition corresponding to a liquid crystal composition obtained by eliminating only the chiral agent from the liquid crystal composition for forming the cholesteric liquid crystal layer, at 50° C. is preferably 0.040 to 0.110. The front phase difference can be measured by using AxoScan manufactured by Axometrics, Inc.

Examples of the low birefringence liquid crystal compound include compounds described in WO2015/115390A, WO2015/147243A, WO2016/035873A, JP2015-163596A, and JP2016-053149A. Regarding the liquid crystal composition for providing a selective reflection layer having a small half-width, WO2016/047648A can be referred to.

The liquid crystal compound is preferably a polymerizable compound represented by Formula (I) described in WO2016/047648A.

In the formula, A represents a phenylene group which may have a substituent or a trans-1,4-cyclohexylene group which may have a substituent, L represents a single bond or a linking group selected from the group consisting of —CH$_2$O—, —OCH$_2$—, —(CH$_2$)$_2$OC(=O)—, —C(=O)O(CH$_2$)$_2$—, —C(=O)O—, —OC(=O)—, —OC(=O)O—, —CH=CHC(=O)O—, and —OC(=O)—CH=CH—, m represents an integer of 3 to 12, Sp$^1$ and Sp$^2$ each independently represent a single bond or a linking group selected from the group consisting of a linear or branched alkylene group having 1 to 20 carbon atoms, and a group in which one or two or more —CH$_2$—'s in the linear or branched alkylene group having 1 to 20 carbon atoms are substituted with —O—, —S—, —NH—, —N(CH$_3$)—, —C(=O)—, —OC(=O)—, or —C(=O)O—, and Q$^1$ and Q$^2$ each independently represent a hydrogen atom or a polymerizable group selected from the group consisting of groups represented by Formulae Q-1 to Q-5, where either Q$^1$ or Q$^2$ represents a polymerizable group.

In Formula (I), the phenylene group is preferably a 1,4-phenylene group.

The substituent of the phenylene group and the trans-1,4-cyclohexylene group "which may have a substituent" is not particularly limited, and examples of the substituent include a substituent selected from the group consisting of an alkyl group, a cycloalkyl group, an alkoxy group, an alkyl ether group, an amide group, an amino group, a halogen atom, and a group configured by combining two or more substituents described above. In addition, examples of the substituent include a substituent represented by —C(=O)—X$^3$-Sp$^3$-Q$^3$ described later. The phenylene group and the trans-1,4-cyclohexylene group may have 1 to 4 substituents. When the phenylene group and the trans-1,4-cyclohexylene group have two or more substituents, the two or more substituents may be identical to each other or different from each other.

In the present specification, the alkyl group may be any one of a linear alkyl group and a branched alkyl group. The number of carbon atoms of the alkyl group is preferably 1 to 30, is more preferably 1 to 10, and is particularly preferably 1 to 6. Examples of the alkyl group can include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 1,1-dimethyl propyl group, an n-hexyl group, an isohexyl group, a linear heptyl group or a branched heptyl group, an octyl group, a nonyl group, a decyl group, a undecyl group, and a dodecyl group. The same description with respect to the alkyl group described above applies to an alkoxy group including the alkyl group. In addition, in the present specification, regarding the alkylene group, specific examples of the alkylene group include a divalent group or the like obtained by removing one random hydrogen atom from each of the examples of the alkyl group described above. Examples of the halogen atom include a fluorine atom, a chlorine atom, a bromine atom, and an iodine atom.

In the present specification, the number of carbon atoms of the cycloalkyl group is preferably 3 to 20, is more preferably 5 or more, and is preferably 10 or less, is more preferably 8 or less, and is even more preferably 6 or less. Examples of the cycloalkyl group can include a cyclopropyl group, a cyclobutyl group, a cyclopentyl group, a cyclohexyl group, a cycloheptyl group, and a cyclooctyl group.

In particular, as the substituent that the phenylene group and the trans-1,4-cyclohexylene group may have, a substituent selected from the group consisting of an alkyl group, an alkoxy group, and —C(=O)—$X^3$-$Sp^3$-$Q^3$ is preferable. Here, $X^3$ represents a single bond, —O—, —S—, or —N($Sp^4$-$Q^4$)— or represents a nitrogen atom which forms a cyclic structure along with $Q^3$ and $Sp^3$. $Sp^3$ and $Sp^4$ each independently represent a single bond or a linking group selected from the group consisting of a linear or branched alkylene group having 1 to 20 carbon atoms, and a group in which one or two or more —$CH_2$—'s in the linear or branched alkylene group having 1 to 20 carbon atoms are substituted with —O—, —S—, —NH—, —N($CH_3$)—, —C(=O)—, —OC(=O)—, or —C(=O)O—.

$Q^3$ and $Q^4$ each independently represent any one polymerizable group selected from the group consisting of a hydrogen atom, a cycloalkyl group, a group in which one or two or more —$CH_2$—'s in the cycloalkyl group are substituted with —O—, —S—, —NH—, —N($CH_3$)—, —C(=O)—, —OC(=O)—, or —C(=O)O—, or groups represented by Formulae Q-1 to Q-5.

Specifically, examples of the group in which one or two or more —$CH_2$—'s in the cycloalkyl group are substituted with —O—, —S—, —NH—, —N($CH_3$)—, —C(=O)—, —OC(=O)—, or —C(=O)O— include a tetrahydrofuranyl group, a pyrrolidinyl group, an imidazolidinyl group, a pyrazolidinyl group, a piperidyl group, a piperazinyl group, an da morpholinyl group. A substitution position is not particularly limited. Among these, a tetrahydrofuranyl group is preferable and a 2-tetrahydrofuranyl group is particularly preferable.

In Formula (I), L represents a single bond or a linking group selected from the group consisting of —$CH_2$O—, —$OCH_2$—, —$(CH_2)_2OC(=O)$—, —$C(=O)O(CH_2)_2$—, —C(=O)O—, —OC(=O)—, —OC(=O)O—, —CH=CH—C(=O)O—, and —OC(=O)—CH=CH—.

It is preferable that L represents —C(=O)O— or —OC(=O)—. m L's may be identical to each other or different from each other.

$Sp^1$ and $Sp^2$ each independently represent a single bond or a linking group selected from the group consisting of a linear or branched alkylene group having 1 to 20 carbon atoms, and a group in which one or two or more —$CH_2$—'s in the linear or branched alkylene group having 1 to 20 carbon atoms are substituted with —O—, —S—, —NH—, —N($CH_3$)—, —C(=O)—, —OC(=O)—, or —C(=O)O—. It is preferable that $Sp^1$ and $Sp^2$ each independently represent a linking group configured by combining one or two or more groups selected from the group consisting of a linear alkylene group having 1 to 10 carbon atoms in which a linking group selected from the group consisting of —O—, —OC(=O)—, and —C(=O)O— is bonded to both terminals, —OC(=O)—, —C(=O)O—, —O—, and a linear alkylene group having 1 to 10 carbon atoms, and it is more preferable that $Sp^1$ and $Sp^2$ each independently represent a linear alkylene group having 1 to 10 carbon atoms in which —O— is bonded to each of both terminals.

$Q^1$ and $Q^2$ each independently represent a polymerizable group selected from the group consisting of a hydrogen atom, or groups represented by Formulae (Q-1) to (Q-5), and any one of $Q^1$ and $Q^2$ represents a polymerizable group.

As the polymerizable group, an acryloyl group (Formula (Q-1)) or a methacryloyl group (Formula (Q-2)) is preferable.

In Formula (I), m represents an integer of 3 to 12, preferably represent s an integer of 3 to 9, more preferably represent s an integer of 3 to 7, and even more preferably represent s an integer of 3 to 5.

It is preferable that the polymerizable compound represented by Formula (I) includes at least one phenylene group which may have a substituent and at least one trans-1,4-cyclohexylene group which may have a substituent for A. The polymerizable compound represented by Formula (I) preferably includes 1 to 4 trans-1,4-cyclohexylene groups which may have a substituent, more preferably includes 1 to 3 trans-1,4-cyclohexylene groups which may have a substituent, and even more preferably includes 2 or 3 trans-1,4-cyclohexylene groups which may have a substituent for A. The polymerizable compound represented by Formula (I) preferably includes one phenylene group which may have a substituent, more preferably includes 1 to 4 phenylene groups which may have a substituent, even more preferably includes 1 to 3 phenylene groups which may have a substituent, and particularly preferably includes 2 or 3 phenylene groups which may have a substituent for A.

In Formula (I), when the number obtained by dividing the number of trans-1,4-cyclohexylene groups represented by A by m is set to mc, $0.1<mc<0.9$ is preferably satisfied, $0.3<mc<0.8$ is more preferably satisfied, and $0.5<mc<0.7$ is even more preferably satisfied. The liquid crystal composition preferably includes the polymerizable compound represented by Formula (I) and satisfying $0.5<mc<0.7$ and the polymerizable compound represented by Formula (I) and satisfying $0.1<mc<0.3$.

Specifically, examples of the polymerizable compound represented by Formula (I) include, as well as compounds described in paragraphs 0051 to 0058 of WO2016/047648A, compounds described in JP2013-112631A, JP2010-070543A, JP4725516B, WO2015/115390A, WO2015/147243A, WO2016/035873A, JP2015-163596A, and JP2016-053149A.

(Chiral Agent: Optically Active Compound)

The liquid crystal composition preferably includes a chiral agent. The chiral agent has a function of inducing the helical structure of the cholesteric liquid crystalline phase. The chiral compound may be selected according to the purpose since compounds are different in the helix pitch or the sense of the helix to be induced.

The chiral agent is not particularly limited, and a known compound can be used. Examples of the chiral agent include compounds described in Liquid Crystal Device Handbook (Chapter 3, Paragraph 4-3, Chiral Agent for TN and STN, Page 199, Japan Society for the Promotion of Science edited by 142nd committee, 1989), JP2003-287623A, JP2002-302487A, JP2002-080478A, JP2002-080851A, JP2010-181852A, and JP2014-034581A.

In general, the chiral agent includes an asymmetric carbon atom, but an axial asymmetric compound or a planar asymmetric compound which does not include an asymmetric carbon atom can also be used as the chiral agent. Examples of the axial asymmetric compound or the planar asymmetric compound include binaphthyl, helicene, paracyclophane, and derivatives thereof. The chiral agent may have a polymerizable group. In a case where both of the chiral agent and the liquid crystal compound have a polymerizable group, a polymer having a repeating unit derived from the polymerizable liquid crystal compound and a repeating unit derived from the chiral agent can be formed by a polymerization reaction between the polymerizable chiral agent and the polymerizable liquid crystal compound. In this embodiment, it is preferable that the polymerizable group of the polymerizable chiral agent is identical to the polymerizable group of the polymerizable liquid crystal compound. Accordingly, it is preferable that the polymerizable group of the chiral agent is also an unsaturated polymerizable group, an epoxy group, or an aziridinyl group, an unsaturated polymerizable group is more preferable, and an ethylenically unsaturated polymerizable group is particularly preferable.

In addition, the chiral agent may be a liquid crystal compound.

As the chiral agent, an isosorbide derivative, an isomannide derivative, or a binaphthyl derivative can be preferably used. As the isosorbide derivative, a commercially available product such as LC-756 manufactured by BASF SE or the like may be used.

The content of the chiral agent in the liquid crystal composition is preferably 0.01% to 200% by mole and more preferably 1.0% to 30% by mole with respect to the total molar amount of the polymerizable liquid crystal compound.

(Polymerization Initiator)

It is preferable that the liquid crystal composition includes a polymerization initiator. In an embodiment in which a polymerization reaction is carried out by ultraviolet irradiation, a polymerization initiator to be used is preferably a photopolymerization initiator which can initiate a polymerization reaction by ultraviolet irradiation and particularly preferably a radical photopolymerization initiator. Examples of the radical photopolymerization initiator include an α-carbonyl compound (described in each of U.S. Pat. Nos. 2,367,661A and 2,367,670A), acyloin ether (described in U.S. Pat. No. 2,448,828A), an α-hydrocarbon substituted aromatic acyloin compound (described in U.S. Pat. No. 2,722,512A), a polynuclear quinone compound (described in each of U.S. Pat. Nos. 3,046,127A and 2,951,758A), a combination of a triaryl imidazole dimer and p-aminophenyl ketone (described in U.S. Pat. No. 3,549,367A), an acridine compound and phenazine compound (described in JP-1985-105667A (JP-S60-105667A) and U.S. Pat. No. 4,239,850A), an acylphosphine oxide compound (described in each of JP1988-040799B (JP-S63-040799B), JP1993-029234B (JP-H05-029234B), JP1998-095788A (JP-H10-095788A), and JP1998-029997A (JP-H10-029997A), an oxime compound (described in each of JP1988-040799B (JP-S63-040799B), JP1993-029234B (JP-H05-029234B), JP1998-095788A (JP-H10-095788A), JP1998-029997A (JP-H10-029997A), JP2001-233842A, JP2000-080068A, JP2006-342166A, JP2013-114249A, JP2014-137466A, JP4223071B, JP2010-262028A, and JP2014-500852A), and an oxadiazole compound (described in U.S. Pat. No. 4,212,970A). For example, the description of paragraphs 0500 to 0547 of JP2012-208494A can also be referred to.

As the polymerization initiator, an acylphosphine oxide compound or an oxime compound is preferably used.

As an example of the acylphosphine oxide compound, a commercially available product IRGACURE 819 manufactured by BASF SE (compound name: bis(2,4,6-trimethylbenzoyl)-phenylphosphine oxide) can be used. As the oxime compound, commercially available products such as IRGACURE OXE01 (manufactured by BASF SE), IRGACURE OXE02 (manufactured by BASF SE), TR-PBG-304 (manufactured by Changzhou Tronly New Electronic Materials CO., LTD), ADEKA ARKLS NCI-831, ADEKA ARKLS NCI-930 (manufactured by ADEKA Corporation) can be used.

The polymerization initiators may be used alone or in combination of two or more kinds thereof.

The content of the polymerization initiator in the liquid crystal composition is preferably 0.1% to 20% by mass and more preferably 0.5% by mass to 5.0% by mass with respect to the content of the polymerizable liquid crystal compound.

(Crosslinking Agent)

The liquid crystal composition may include a random crosslinking agent to improve the film hardness after curing and durability. As the crosslinking agent, a material which is curable with ultraviolet rays, heat, moisture, or the like can be suitably used.

The crosslinking agent is not particularly limited, and can be appropriately selected in accordance with the purpose. Examples thereof include polyfunctional acrylate compounds such as trimethylolpropane tri(meth)acrylate and pentaerythritol tri(meth)acrylate; epoxy compounds such as glycidyl(meth)acrylate and ethylene glycol diglycidyl ether; aziridine compounds such as 2,2-bishydroxymethylbutanol-tris[3-(1-aziridinyl)propionate] and 4,4-bis(ethyleneiminocarbonylamino)diphenylmethane; isocyanate compounds such as hexamethylene diisocyanate and biuret-type isocyanate; polyoxazoline compounds having an oxazoline group in a side chain; and alkoxysilane compounds such as vinyltrimethoxysilane and N-(2-aminoethyl) 3-aminopropyltrimethoxysilane. A known catalyst can be used depending on the reactivity of the crosslinking agent in order to improve productivity in addition to the enhancement of the film hardness and the durability. These may be used alone or in combination of two or more kinds thereof.

The content of the crosslinking agent in the liquid crystal composition is preferably 3.0% by mass to 20% by mass and more preferably 5.0% by mass to 15% by mass. In a case where the content of the crosslinking agent is 3.0% by mass or more, the crosslinking density improving effect can be obtained. In addition, in a case where the content of the crosslinking agent is 20 mass % or less, the stability of a layer to be formed can be maintained.

(Alignment Control Agent)

In the liquid crystal composition, an alignment control agent may be added to contribute to stable or rapid planar alignment. Examples of the alignment control agent include fluorine (meth)acrylate-based polymers described in paragraphs 0018 to 0043 in JP2007-272185A and compounds represented by Formulae (I) to (IV) described in paragraphs 0031 to 0034 in JP2012-203237A.

The alignment control agents may be used alone or in combination of two or more kinds thereof.

The amount of the alignment control agent added in the liquid crystal composition is preferably 0.01% by mass to 10% by mass, more preferably 0.01% by mass to 5.0% by mass, and particularly preferably 0.02% by mass to 1.0% by mass with respect to the total mass of the polymerizable liquid crystal compound.

(Other Additives)

Additionally, the liquid crystal composition may include at least one selected from various additives such as a surfactant for making the film thickness uniform by adjusting the surface tension of the coating film, and a polymerizable monomer. Furthermore, if necessary, within a range that does not deteriorate the optical performance, a polymerization inhibitor, an antioxidant, an ultraviolet absorber, a light stabilizer, a coloring material, metal oxide particles, and the like can be added to the liquid crystal composition.

(Solvent)

The solvent used to prepare the liquid crystal composition is not particularly limited, and can be appropriately selected according to the purpose. An organic solvent is preferably used.

The organic solvent is not particularly limited, and can be appropriately selected according to the purpose. Examples thereof include ketones, alkyl halides, amides, sulfoxides, heterocyclic compounds, hydrocarbons, esters, and ethers. These may be used alone or in combination of two or more kinds thereof. Among these, ketones are particularly preferable in consideration of the load imposed on the environment.

(Coating, Alignment, and Polymerization)

The method of applying the liquid crystal composition to a temporary support, an alignment film, a cholesteric liquid crystal layer serving as an underlayer, or the like is not particularly limited, and can be appropriately selected according to the purpose. Examples thereof include a wire bar coating method, a curtain coating method, an extrusion coating method, a direct gravure coating method, a reverse gravure coating method, a die coating method, a spin coating method, a dip coating method, a spray coating method, and a slide coating method. Further, the coating can also be performed by transferring a liquid crystal composition, which has been separately applied onto a support. By heating the liquid crystal composition applied, the liquid crystal molecules are aligned in a cholesteric manner. In a case of the cholesteric alignment, the heating temperature is preferably 200° C. or lower and more preferably 130° C. or lower. By this alignment treatment, an optical thin film is obtained in which the polymerizable liquid crystal compound is aligned in a twisted manner to have a helical axis in a direction substantially perpendicular to the surface of the film.

The aligned liquid crystal compound can be further subjected to polymerization so as to cure the liquid crystal composition. The polymerization may be any one of thermal polymerization and photopolymerization using light irradiation, but is preferably photopolymerization. Ultraviolet rays are preferably used for light irradiation. The irradiation energy is preferably 20 mJ/cm$^2$ to 50 J/cm$^2$ and more preferably 100 mJ/cm$^2$ to 1,500 mJ/cm$^2$. In order to accelerate the photopolymerization reaction, the light irradiation may be performed under heating conditions or in a nitrogen atmosphere. The wavelength of the ultraviolet rays for irradiation is preferably 350 nm to 430 nm. From the viewpoint of stability, the rate of the polymerization reaction is preferably high. The rate of the polymerization reaction is preferably 70% or higher and more preferably than 80% or higher. The rate of the polymerization reaction can be determined by measuring the consumption rate of polymerizable groups by using an IR absorption spectrum.

The thickness of each cholesteric liquid crystal layer is not particularly limited as long as it is in such a range that the above-described characteristics are exhibited. The thickness is preferably in a range of 1.0 μm or more and 150 μm or less and more preferably in a range of 4.0 μm or more and 100 μm or less.

(Temporary Support and Support)

The liquid crystal composition may be applied to the surface of a support, a temporary support, or an alignment layer formed on the surface of the support or the temporary support to form a layer.

The temporary support, or the temporary support and the alignment layer may be peeled off after the formation of the layer. For example, the temporary support, or the temporary support and the alignment may be bonded to a base material and then peeled off from the base material according to the application of the selective reflection layer. The temporary support may function as a protective film until the temporary support is bonded to the base material.

The support may remain as a layer constituting the blue light blocking film without being peeled off.

Examples of the temporary support and the support include a plastic film and a glass plate. Examples of the material of the plastic film include polyester such as polyethylene terephthalate (PET), an epoxy resin, polyamide, a cellulose derivative such as triacetylcellulose, silicone, a styrene resin, a diethylene glycol bisallyl carbonate resin (CR-39), a polyurethane resin, a thiourethane resin, an episulfide resin, a polycarbonate resin, a (meth)acrylic resin, and a polyolefin resin. As the temporary support, a polyethylene terephthalate (PET) film is preferable, and as the support, a triacetylcellulose film is preferable.

The thickness of the temporary support and the support may be about 10 μm to 10 is preferably 100 μm to 5 mm, more preferably 200 μm to 2 mm, and even more preferably 500 μm to 1000 μm.

(Alignment Layer)

The alignment layer can be provided by means of a rubbing treatment of an organic compound such as a polymer (a resin such as polyimide, polyvinyl alcohol, polyester, polyarylate, polyamide imide, polyether imide, polyamide, and modified polyamide), oblique vapor deposition of an inorganic compound, formation of a layer having a microgroove, or accumulation of an organic compound (for example, ω-tricosanoic acid, dioctadecyl methyl ammonium chloride, and methyl stearate) using a LANGMUIR-BLODGETT method (an LB film). Further, an alignment layer may be used in which an alignment function occurs by application of an electric field, application of a magnetic field, or light irradiation.

In particular, it is preferable that an alignment layer formed of a polymer is subjected to a rubbing treatment, and then, a liquid crystal composition is applied to a rubbing treatment surface. The rubbing treatment can be performed by rubbing the surface of the polymer layer with paper and cloth in a constant direction a plurality of times.

The liquid crystal composition may be applied to the surface of the temporary support or the surface of the temporary support which is subjected to the rubbing treatment without providing the alignment layer.

The thickness of the alignment layer is preferably 0.01 μm to 5.0 μm and more preferably 0.05 μm to 2.0 μm.

(Lamination Film of Layers Formed of Polymerizable Liquid Crystal Compound)

In the formation of a lamination film formed of a plurality of cholesteric liquid crystal layers, a step of directly applying a liquid crystal composition including a polymerizable liquid crystal compound or the like to the surface of a cholesteric liquid crystal layer and an alignment step, and a fixing step may be repeated. Otherwise, a cholesteric liquid crystal layer prepared separately may be laminated using an adhesive or the like. However, the former is preferable. The reason for this is that, interference unevenness resulting from thickness unevenness of the adhesive layer is not easily observed. In addition, in the lamination film of cholesteric liquid crystal layers, in a case where the next cholesteric liquid crystal layer is formed so as to be in direct contact with the surface of the cholesteric liquid crystal layer formed previously, the alignment direction of liquid crystal molecules on the air interface side of the cholesteric liquid crystal layer formed previously is identical to the alignment direction of liquid crystal molecules on the lower side of the cholesteric liquid crystal layer formed thereon, and the polarization characteristics of the laminate of the cholesteric liquid crystal layers are enhanced.

[Interference Film Including Laminate of Organic Layers]

Regarding an interference film including a laminate of organic layers, for example, JP1997-506837A (JP-H09-506837A) or JP2007-271896A can be referred to. With reference to these documents, an interference film is prepared by laminating organic layers which are formed using various organic materials and have different refractive indices from each other. By adjusting the materials and the thickness, a selective reflection layer which exhibits selective reflection of a center wavelength in a wavelength range of 450 nm to 500 nm with a half-width of 20 nm to 45 nm can be formed. As a commercially available product, for example, DBEF (registered trademark) (manufactured by 3M Company).

As described in JP2007-271896A, in the interference film including the laminate of the organic layers, similarly to the cholesteric liquid crystal layer, in a case where light is incident to the interference film in an oblique direction, the apparent center wavelength of selective reflection shifts to the short wavelength side. Accordingly, as in a case where the cholesteric liquid crystal layers are used, a yellowish tint is not easily recognized in a blue light blocking film prepared using the interference film including the laminate of the organic layers when viewed in an oblique direction.

In the interference film including the laminate of the organic layers, the thickness of each organic layer is preferably 50 nm to 500 nm and more preferably 100 nm to 300 nm. The thickness of the entire interference film including the laminate of the organic layers is preferably in a range of 1.0 μm to 30 μm and more preferably in a range of 5.0 μm to 30 μm.

<Adhesive Layer>

The blue light blocking film according to the embodiment of the present invention may include an adhesive layer.

The adhesive layer may be formed of an adhesive including a compound such as an acrylate-based compound, a urethane-based compound, a urethane acrylate-based compound, an epoxy-based compound, an epoxy acrylate-based compound, a polyolefin-based compound, a modified olefin-based compound, a polypropylene-based compound, an ethylene vinyl alcohol-based compound, a vinyl chloride-based compound, a chloroprene rubber-based compound, a cyanoacrylate-based compound, a polyamide-based compound, a polyimide-based compound, a polystyrene-based compound, or a polyvinyl butyral-based compound. From the viewpoint of optical transparency and heat resistance, an acrylate-based compound, a urethane acrylate-based compound, an epoxy acrylate-based compound, and the like are preferably used. As the adhesive, from the viewpoint of a curing method, there are a hot melt type adhesive, a thermal curing type adhesive, a photocuring type adhesive, a reaction curing type adhesive, and a pressure sensitive adhesion type adhesive in which curing is not necessary.

As the hot melt type adhesive layer, a thermoplastic welding layer may be used. The thermoplastic welding layer is a layer formed by bonding two layers through melting by heating and then cooling.

The adhesive layer for bonding the selective reflection layer and another layer is more preferably formed of a pressure sensitive adhesion type adhesive in which curing is not necessary. Examples of the pressure sensitive adhesion type adhesive include an acrylate-based adhesive, a urethane-based adhesive, and a silicone-based adhesive. An acrylate-based adhesive is particularly preferable.

From the viewpoint of workability and productivity, a photocuring type adhesive is preferable as a curing method.

The adhesive may be in the form of a sheet or a liquid.

As a sheet-like adhesive, in addition to the pressure sensitive adhesion type adhesive in which curing is not necessary, a type that performs thermal curing or photocuring after a sheet is arranged may be used. In a case of application of a sheet-like adhesive, for example, an optically clear adhesive tape (OCA tape) can be used. The OCA tape is generally commercially available in a form having a peelable protective sheet on one or both sides of the adhesive layer, and this adhesive layer can be used as the adhesive layer. As an OCA tape that can be used as a sheet-like adhesive, a commercially available product for an image display device, in particular, a commercially available product for an image display portion surface of an image display device may be used. Examples of commercially available products include pressure sensitive sheets (PD-S1 and the like) manufactured by PANAC Co., Ltd., MHM series pressure sensitive sheets manufactured by NICHIEI KAKOH CO., LTD., and OCA 8146 manufactured by 3M Company.

As a liquid adhesive, for example, an optically clear resin (OCR) may be used.

The thickness of the adhesive layer is preferably 0.50 μm or more and 50 μm or less and more preferably 1.0 μm or more and 25 μm or less.

<<Application of Blue Light Blocking Film>>

The blue light blocking film according to the embodiment of the present invention can be used for various applications as a film for effectively blocking blue light. For example, the blue light blocking film can be attached to an image display surface of an image display device such as a personal computer or a smartphone and used. In addition, the blue light blocking film can be used as a filter for blocking blue light in a light source and an illumination device. Further, a lens for eyeglasses may be configured to include the blue light blocking film according to the embodiment of the present invention. By using the blue light blocking film according to the embodiment of the present invention, it is possible to particularly block light in a wavelength range having a great influence on the circadian rhythm. In addition, since a yellowish tint is suppressed in the blue light blocking film according to the embodiment of the present invention, even in a case where the blue light blocking film is applied to an illumination device or a lens for eyeglasses, the aesthetic appearance is not impaired.

[Light Source]

As a preferable example of the application of the blue light blocking film, a light source may be exemplified.

The light source may include a light emitting element and the blue light blocking film. The blue light blocking film is arranged on the light emission side of the light source with respect to the light emitting element. The light source may have a base material on the light emission side of the light source with respect to the light emitting element and the blue light blocking film may be bonded to the surface of the base material. In this case, the light emitting element, the base material, and the blue light blocking film are preferably arranged in this order. The light source may include a mirror reflector for reflecting light, which is light emission from the light emitting element and is not directly incident to the selective reflection layer, to be incident to the selective reflection layer. In a case where the light emitting element is formed such that a semiconductor is formed on a substrate, it is preferable that the semiconductor is arranged in a space formed by the blue light blocking film and the substrate, a space formed by the blue light blocking film and the mirror reflector, or a space formed by the blue light blocking film, the substrate, and the mirror reflector. It is more preferable that the semiconductor is arranged in the space formed by the blue light blocking film, the substrate, and the mirror reflector. The light source preferably includes a phosphor, and the phosphor may also be arranged in the space. Further, the light source may include a wiring board, an insulation substrate, an electrode, and the like.

The respective spaces may be sealed or may not be sealed.

The space may be filled with a transparent resin. The transparent resin is preferably a thermosetting resin. Among thermosetting resins, at least one selected from the group consisting of an epoxy resin, a modified epoxy resin, a silicone resin, a modified silicone resin, an acrylate resin, a urethane resin, and a polyimide resin is preferable and an epoxy resin, a modified epoxy resin, a silicone resin, and a modified silicone resin are particularly preferable. As the transparent resin, a hard resin for protecting the light emitting element is preferable. In addition, as the transparent resin, a resin excellent in heat resistance, weather fastness, and light fastness is preferably used. The transparent resin may include at least one selected from the group consisting of a filler, a dispersing agent, a pigment, a fluorescent substance, a reflective material, an ultraviolet absorber, and an antioxidant.

Examples of the light source include a stem type light source and a shell type light source and a shell type light source is preferable. In a case of a shell type light source, the directivity is preferably 20° or less and more preferably 15° or less.

(Light Emitting Element)

The light source includes a light emitting element. The light source may include one kind of light emitting element or two or more kinds of light emitting elements.

Examples of the light emitting element include a light emitting diode (LED), and a laser diode (LD).

It is preferable that the light emitting element emits light in an ultraviolet light or blue light range. Specifically, the light emitting element preferably exhibits the peak of the emission spectrum in a wavelength range of 200 nm to 500 nm and more preferably exhibits the peak of the emission spectrum in a wavelength range of 380 nm to 500 nm.

As the LED, for example, an LED in which a GaAlN-based, ZnS-based, ZnSe-based, SiC-based, GaP-based, GaAlAs-based, AlN-based, InN-based, AlInGaP-based, InGaN-based, GaN-based, or AlInGaN-based semiconductor is formed on a substrate as a light emitting layer can be used. A semiconductor having a homo-structure, hetero-structure, or double hetero-structure having an MIS junction, a PIN junction, or a PN junction as a structure of the semiconductor may be used.

As the LD, for example, an InGaN-based, InGaNAs-based, or GaNAs-based semiconductor can be used.

As the substrate on which the semiconductor is formed, an electrode substrate having an electrode for external connection may be used.

(Phosphor)

In a case where the light source is a white light source including an LED light emitting element, the light source preferably includes a phosphor. The phosphor is not particularly limited as long as the phosphor is excited by light emission of the light emitting element to emit fluorescence. For example, a white light source can be obtained by causing the light emitting element to emit light in a blue light range and the phosphor to emit yellow fluorescence. The light source may include one kind of phosphor or may include two or more kinds of phosphors. When the light emitting element emits light in a blue light range, a white light source can be obtained by using a phosphor that emits fluorescence in a green light range and a phosphor that emits fluorescence in a red light range.

In the light source according to the embodiment of the present invention, the phosphor can preferably emit fluorescence excited by light that is reflected on the selective reflection layer and is incident to the phosphor. By using such a phosphor, the reflected light is also reused for excitation of the phosphor and thus the energy efficiency of the light source is enhanced.

As the phosphor, a phosphor that is excited by ultraviolet light or blue light and emits fluorescence in a range of more than 500 nm and 780 nm or less is preferable, a phosphor that is excited by blue light and emits fluorescence in a range of more than 500 nm and 780 nm or less is more preferable. Examples thereof include a nitride-based phosphor, an oxynitride-based phosphor, a sialon-based phosphor, and a β sialon-based phosphor which are activated mainly with a lanthanide element such as Eu or Ce; an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, an alkaline earth silicon nitride phosphor, and a germinate phosphor which are activated mainly with a lanthanoid element such as Eu and a transition metal element such as Mn; a rare earth aluminate phosphor and a rare earth silicate phosphor which are activated mainly with a lanthanoid element such as Ce; and an organic complex which is activated mainly with a lanthanoid element such as Eu. As described above, these may be used alone or in combination of two or more kinds thereof.

The phosphor may be dispersed in a transparent resin. As the transparent resin, the same transparent resins as the above-described transparent resins can be used.

EXAMPLES

Hereinafter, the present invention will be described in more detail with reference to examples. The materials, the reagents, the amounts of materials, the proportions thereof, the operations, and the like which will be shown in the following examples can be appropriately modified within a range not departing from the gist of the invention. Accordingly, the scope of the invention is not limited to the following examples.

The birefringence (Δn) of each compound in examples is Δn at 60° C. obtained by injecting the compound into a wedge-shaped cell, irradiating the compound with light of a wavelength of 550 nm, and measuring the refraction angle of the transmitted light.

Preparation of Film

Example 1 a compound 20 (Δn: 0.11) described in JP2016-053149A, a fluorine-based horizontal alignment agent 1, a fluorine-based horizontal alignment agent 2, a right turning chiral agent, a polymerization initiator, and a solvent (methyl ethyl ketone) were mixed to prepare a coating liquid having the following composition. The obtained coating liquid was used as a coating liquid R1 as a cholesteric liquid crystalline mixture.

| | |
|---|---|
| Compound 20 | 100 parts by mass |
| Fluorine-based horizontal alignment agent 1 | 0.1 parts by mass |
| Fluorine-based horizontal alignment agent 2 | 0.007 parts by mass |
| Right turning chiral agent LC 756 (manufactured by BASF SE) | 6.6 parts by mass |
| Polymerization initiator IRGACURE 819 (manufactured by BASF SE) | 3.0 parts by mass |
| Solvent (methyl ethyl ketone) | The amount set such that the concentration of the solute was 30 mass %. |

Left Turning Chiral Agent (A)

Bu = n-butyl group

The surface of a PET film (thickness: 50 μm, size: 320 mm×400 mm, manufactured by Fujifilm Corporation) was subjected to a rubbing treatment (Rayon cloth, pressure: 0.1 kgf (0.98 N), rotation speed: 1000 rpm, transportation speed: 10 m/min, number of times: 1 one round trip).

Next, the coating liquid R1 was applied to the rubbed surface of the PET film using a wire bar at room temperature such that the thickness of the film after drying became 8.0 μm.

The coating liquid was dried for 30 seconds at room temperature to remove the solvent, and then the residue was heated for 2 minutes in an atmosphere at 90° C., and then allowed to enter a state of a cholesteric liquid crystalline phase. Subsequently, the resultant was cooled to 35° C. Next, the resultant was irradiated with UV for 6 to 12 seconds at an output of 60% using an electrodeless lamp "D valve" (90 mW/cm) manufactured by Fusion UV systems Inc., and the cholesteric liquid crystalline phase was fixed, thereby forming a cholesteric liquid crystal layer on the PET film.

Compound 20

The compound 20, fluorine-based horizontal alignment agents, a left turning chiral agent, a polymerization initiator, and a solvent (methyl ethyl ketone) were mixed to prepare a coating liquid having the following composition. The obtained coating liquid was used as a coating liquid L1 as a cholesteric liquid crystalline mixture.

| | |
|---|---|
| Compound 20 | 100 parts by mass |
| Fluorine-based horizontal alignment agent 1 | 0.1 parts by mass |
| Fluorine-based horizontal alignment agent 2 | 0.007 parts by mass |
| Left turning chiral agent (A) below | 10.1 parts by mass |
| Polymerization initiator IRGACURE 819 (manufactured by BASF SE) | 3.0 parts by mass |
| Solvent (methyl ethyl ketone) | The amount set such that the concentration of the solute was 30 mass %. |

The coating liquid L1 was applied to the surface of the obtained cholesteric liquid crystal layer using a wire bar at room temperature such that the thickness of the film after drying became 8.0 μm.

The coating liquid was dried for 30 seconds at room temperature to remove the solvent, and then the residue was heated for 2 minutes in an atmosphere at 90° C., and then allowed to enter a state of a cholesteric liquid crystalline phase. Subsequently, the resultant was cooled to 35° C. Next, the resultant was irradiated with UV for 6 to 12 seconds at an output of 60% using an electrodeless lamp "D valve" (90 mW/cm) manufactured by Fusion UV systems Inc., and the cholesteric liquid crystalline phase was fixed, thereby preparing a film of Example 1 including one cholesteric liquid crystal layer selectively reflecting right circularly polarized light and one cholesteric liquid crystal layer selectively reflecting left circularly polarized light.

23

Example 2

Coating liquids R2 and L2 respectively having the same compositions as those of the coating liquids R1 and L1 were prepared except that instead of using the compound 20 (100 parts by mass), a compound 52 (Δn: 0.07) (100 parts by mass) described in JP2016-053149A was used.

A film of Example 2 was prepared in the same manner as in Example 1 except that the coating liquids R2 and L2 were applied such that the thickness of each film after drying became 10.0 μm.

Compound 52

Comparative Example 1

Coating liquids R11 and L11 respectively having the same compositions as those of the coating liquids R1 and L1 were prepared except that instead of using the compound 20 (100 parts by mass), the following compound M-1 (Δn: 0.17) (100 parts by mass) was used.

A film of Comparative Example 1 was prepared in the same manner as in Example 1 except that the coating liquids R11 and L11 were applied such that the thickness of each film after drying became 6.0 μm.

Compound M-1

<Transmission Spectrum>

Figure 1:
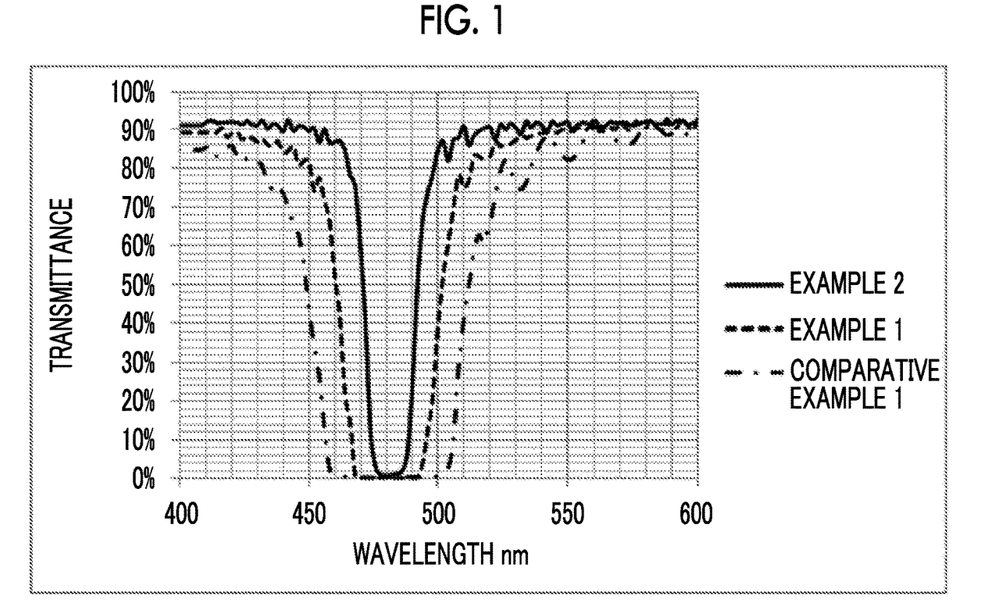
FIG. 1 is a graph showing transmission spectra of films of Examples 1 and 2 and Comparative Example 1.

The transmission spectrum of each film of Examples 1 and 2 and Comparative Example 1 was measured using a spectrophotometer V-670 manufactured by JASCO Corporation. The results are shown in FIG. 1.

From the obtained spectrum, the center wavelength and the half-width were obtained as described above. Further, the light transmittance of each film at the center wavelength was obtained using a spectrophotometer V-670 manufactured by JASCO Corporation. The results are shown in Table 1.

From the shape of the obtained transmission spectrum, regarding the films of Examples 1 and 2, it was determined that there was no wavelength at which the light transmittance was 60% or more at any wavelength in a wavelength range of 400 nm or more and less than 450 nm and a wavelength range of more than 500 nm and 700 nm or less. However, regarding the film of Comparative Example 1, it was determined that there was a wavelength at which the light transmittance was 60% or more at 440 nm to 450 nm.

<Preparation of Light Source Using Film>

Figure 2:
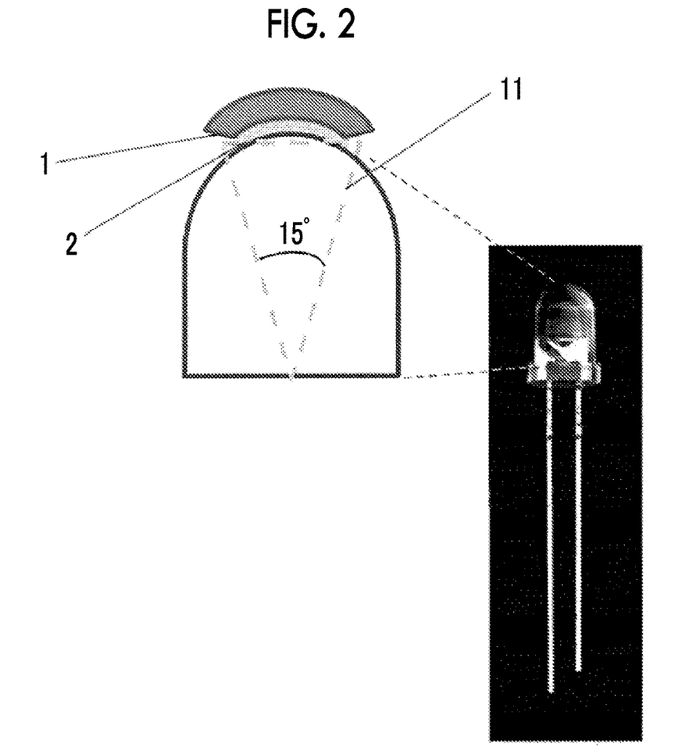
FIG. 2 is a view showing a lamination position of a blue light blocking film with a light source prepared in Example.

Each of the films of Examples 1 and 2 and Comparative Example 1 obtained above was cut into a circular shape having a diameter of 5 mm. In the light emission direction of a shell type white LED: HWDH-A51A-33b (directivity: 15°) manufactured by HRD Co., Ltd., each of the cut films were laminated with a pressure sensitive adhesive (acrylic SK pressure sensitive adhesive, manufactured Soken Chemical & Engineering Co., Ltd.). Then, the PET film was peeled off to obtain a light source shown in FIG. 2. Regarding the obtained light source and the shell type white LED (on which the film was not laminated: Comparative Example 2), the average luminance at a wavelength of 400 nm to 600 nm and the average luminance at a wavelength of 450 nm to 500 nm were measured, the measured average luminance and a reduction rate in luminance after the film was laminated were compared, and thus evaluation was performed based on the following standards.

(Tint)

A: The average luminance reduction rate at 400 nm to 600 nm is 0.85 or more.

B: The average luminance reduction rate at 400 nm to 600 nm is less than 0.85 and 0.70 or more.

C: The average luminance reduction rate at 400 nm to 600 nm is less than 0.70.

Average luminance reduction rate at 400 nm to 600 nm=(average luminance of sample at wavelength of 400 nm to 600 nm)/(average luminance of Comparative Example 2 at wavelength of 400 nm to 600 nm)

(Blue Light Blocking Rate)

A: The luminance average reduction degree at 450 nm to 500 nm is 0.5 or more.

B: The luminance average reduction degree at 450 nm to 500 nm is less than 0.5 and 0.2 or more.

C: The luminance average reduction degree at 450 nm to 500 nm is less than 0.2.

Luminance average reduction degree at 450 nm to 500 nm={(average luminance of Comparative Example 2 at wavelength of 450 nm to 500 nm)−(average luminance of sample at wavelength of 450 nm to 500 nm)}/(average luminance of Comparative Example 2 at wavelength of 450 nm to 500 nm)

The luminance was measured using a luminance meter (LS-150 manufactured by KONICA MINOLTA, INC.) in a dark place. Each illumination device was placed on the front and the luminance was measured such that the measured value in the luminance meter was the maximum.

The results are shown in Table 1.

TABLE 1

|  | Example 1 | Example 2 | Comparative Example 1 | Comparative Example 2 |
| --- | --- | --- | --- | --- |
| Reflection center wavelength of selective reflection layer (nm) | 480 | 480 | 480 | None |
| Half-width (nm) | 40 | 20 | 60 | None |
| Light transmittance at center wavelength (%) | 0.0 | 0.0 | 0.0 | 100.0 |
| Blue light blocking rate (at 450 nm to 500 nm) | A | B | A | C |
| Tint | B | A | C | A |
| Luminance average reduction degree at 450 nm to 500 nm | 0.54 | 0.27 | 0.87 | 0.00 |
| Average luminance reduction rate at 400 nm to 600 nm | 0.76 | 0.86 | 0.60 | 1.00 |

EXPLANATION OF REFERENCES

1: blue light blocking film
2: adhesive layer
11: light emission direction

What is claimed is:

1. A light source comprising:
a light emitting element and a blue light blocking film,
the blue light blocking film comprising
a selective reflection layer,
wherein the selective reflection layer exhibits selective reflection having a center wavelength in a wavelength range of 450 nm to 500 nm, and a half-width of the selective reflection is 20 nm to 45 nm,
a light transmittance of the selective reflection layer at the center wavelength is 50% or less,
the selective reflection layer includes a cholesteric liquid crystal layer formed by curing a cholesteric liquid crystalline phase,
the selective reflection layer includes the cholesteric liquid crystal layer which selectively reflects right circularly polarized light and the cholesteric liquid crystal layer which selectively reflects left circularly polarized light,
a light transmittance of the blue light blocking film at any wavelength in a wavelength range of more than 500 nm and 780 nm or less is 60% or more,
and
the selective reflection layer is arranged on the light emission side of the light source with respect to the light emitting element.

2. The light source according to claim 1,
wherein the light transmittance of the selective reflection layer at the center wavelength is 30% or less.

3. The light source according to claim 1,
wherein a light transmittance of the selective reflection layer at any wavelength in a wavelength range of 400 nm or more and less than 450 nm is 60% or more.

4. The light source according to claim 1,
wherein a light transmittance when light is incident at an angle of 50° with respect to a normal direction of the blue light blocking film is 60% or more at any wavelength in a range of 430 nm to 780 nm.

5. The light source according to claim 1,
wherein the cholesteric liquid crystal layer is a layer formed by curing a liquid crystal composition including a liquid crystal compound having a birefringence Δn of less than 0.15.

6. The light source according to claim 5,
wherein the liquid crystal compound is a polymerizable compound represented by Formula (I), in the formula,
A represents a phenylene group which may have a substituent or a trans-1,4-cyclohexylene group which may have a substituent,
L represents a single bond or a linking group selected from the group consisting of —CH$_2$O—, —OCH$_2$—, —(CH$_2$)$_2$OC(=O)—, —C(=O)O(CH$_2$)$_2$—, —C(=O)O—, —OC(=O)—, —OC(=O)O—, —CH=CH—C(=O)O—, and —OC(=O)—CH=CH—,
m represents an integer of 3 to 12,
Sp$^1$ and Sp$^2$ each independently represent a single bond or a linking group selected from the group consisting of a linear or branched alkylene group having 1 to 20 carbon atoms, and a group in which one or two or more —CH$_2$—'s in the linear or branched alkylene group having 1 to 20 carbon atoms are substituted with —O—, —S—, —NH—, —N(CH$_3$)—, —C(=O)—, —OC(=O)—, or —C(=O)O—, and
Q$^1$ and Q$^2$ each independently represent a hydrogen atom or a polymerizable group selected from the group consisting of groups represented by Formulae Q-1 to Q-5, where either Q$^1$ or Q$^2$ represents a polymerizable group

Q-1

Q-2

Q-3

Q-4

Q-5

7. The light source according to claim 6,
wherein the polymerizable compound represented by Formula (I) includes as A at least one trans-1,4-cyclohexylene group which may have a substituent.

8. The light source according to claim 6,
wherein the polymerizable compound represented by Formula (I) includes as A one to four phenylene groups which may have a substituent.

9. The light source according to claim 7,
wherein the polymerizable compound represented by Formula (I) includes as A one to four phenylene groups which may have a substituent.

10. The light source according to claim 5,
wherein the polymerizable compound represented by Formula (I) is any one of the following compounds 11. The light source according to claim 1,
comprising a base material,
wherein the light emitting element, the base material and the blue light blocking film are arranged in this order, and
the blue light blocking film is bonded to the surface of the base material.

12. The light source according to claim 1,
wherein the light emitting element is an LED.

13. The light source according to claim 1,
wherein the light emitting element is a white LED.

14. The light source according to claim 12,
wherein the light emitting element emits light in an ultraviolet light or blue light range.

15. The light source according to claim 11,
wherein the light emitting element is an LED that emits light in an ultraviolet light or blue light range.

16. The light source according to claim 14, comprising a phosphor,
wherein the phosphor is excited by light emission of the light emitting element to emit fluorescence.

17. The light source according to claim 15, comprising a phosphor,
wherein the phosphor is excited by light emission of the light emitting element to emit fluorescence.

18. The light source according to claim 16,
wherein the phosphor emits fluorescence in a range of more than 500 nm and 780 nm or less.

19. The light source according to claim 16,
wherein the phosphor emits fluorescence excited by light that is reflected on the selective reflection layer and is incident to the phosphor.

20. The light source according to claim 17,
wherein the phosphor emits fluorescence excited by light that is reflected on the selective reflection layer and is incident to the phosphor.

* * * * *